(12) United States Patent
Arakawa et al.

(10) Patent No.: US 12,063,864 B2
(45) Date of Patent: Aug. 13, 2024

(54) PIEZOELECTRIC DEVICE AND METHOD OF MANUFACTURING PIEZOELECTRIC DEVICE

(71) Applicant: FUJIFILM CORPORATION, Tokyo (JP)

(72) Inventors: Takami Arakawa, Kanagawa (JP); Takayuki Naono, Kanagawa (JP)

(73) Assignee: FUJIFILM CORPORATION, Tokyo (JP)

( * ) Notice: Subject to any disclaimer, the term of this patent is extended or adjusted under 35 U.S.C. 154(b) by 781 days.

(21) Appl. No.: 17/153,809

(22) Filed: Jan. 20, 2021

(65) Prior Publication Data

US 2021/0143316 A1 May 13, 2021

Related U.S. Application Data

(63) Continuation of application No. PCT/JP2019/029890, filed on Jul. 30, 2019.

(30) Foreign Application Priority Data

Aug. 30, 2018 (JP) .................. 2018-161453

(51) Int. Cl.
*H10N 30/853* (2023.01)
*H10N 30/00* (2023.01)
*H10N 30/045* (2023.01)

(52) U.S. Cl.
CPC ....... *H10N 30/8554* (2023.02); *H10N 30/045* (2023.02); *H10N 30/101* (2024.05)

(58) Field of Classification Search
CPC ............. H10N 30/1071; H10N 30/045; H10N 30/8554; H10N 30/206
See application file for complete search history.

(56) References Cited

U.S. PATENT DOCUMENTS

2002/0027215 A1  3/2002  Shindo et al.
2009/0127981 A1  5/2009  Koike et al.
(Continued)

FOREIGN PATENT DOCUMENTS

CN     1420106 A      5/2003
CN   101436642 A      5/2009
(Continued)

OTHER PUBLICATIONS

International Search Report issued in International Application No. PCT/JP2019/029890 on Oct. 15, 2019.
(Continued)

*Primary Examiner* — J. San Martin
(74) *Attorney, Agent, or Firm* — SOLARIS Intellectual Property Group, PLLC

(57) ABSTRACT

A piezoelectric device and a manufacturing method thereof in which a piezoelectric film formed of a thin film of a lead zirconate titanate-based perovskite oxide is formed on a substrate, and at least a first region out of the first region and a second region of the piezoelectric film is irradiated with electromagnetic waves having a wavelength of 230 nm or less in a reducing atmosphere to provide a difference in piezoelectric characteristics between the first region and the second region so that the first region has a smaller absolute value of a piezoelectric constant $d_{31}$ and a smaller dielectric loss tan $\delta$ than the second region.

20 Claims, 7 Drawing Sheets

(56) References Cited

U.S. PATENT DOCUMENTS

| | | |
|---|---|---|
| 2010/0045144 A1 | 2/2010 | Koike et al. |
| 2010/0079555 A1 | 4/2010 | Arakawa |
| 2011/0316393 A1 | 12/2011 | Naono et al. |
| 2016/0020381 A1 | 1/2016 | Arakawa |
| 2018/0130942 A1* | 5/2018 | Arakawa ............... C23C 14/088 |
| 2018/0248109 A1 | 8/2018 | Tagashira et al. |
| 2023/0210010 A1* | 6/2023 | Enomoto ............. H10N 30/704 310/311 |

FOREIGN PATENT DOCUMENTS

| | | |
|---|---|---|
| CN | 101661989 A | 3/2010 |
| CN | 102329132 A | 1/2012 |
| CN | 106206931 A | 12/2016 |
| JP | 2001-322870 A | 11/2001 |
| JP | 2002-329844 A | 11/2002 |
| JP | 2005-253274 A | 9/2005 |
| JP | 4114363 B2 | 7/2008 |
| JP | 2008205445 A * | 9/2008 ............. B29C 39/18 |
| JP | 2010-84180 A | 4/2010 |
| JP | 2013-102024 A | 5/2013 |
| JP | 2014-179572 A | 9/2014 |
| JP | 2015-216190 A | 12/2015 |
| JP | 2016-92089 A | 5/2016 |
| JP | 2017-45992 A | 3/2017 |
| WO | 2014/162999 A1 | 10/2014 |
| WO | WO-2023042754 A1 * | 3/2023 |

OTHER PUBLICATIONS

Written Opinion of the ISA issued in International Application No. PCT/JP2019/029890 on Oct. 15, 2019.

Bastani, Y. et al, "Effects of high energy x ray and proton irradiation on lead zirconate titanate thin films' dielectric and piezoelectric response", Applied Physics Letters, vol. 102, 192906, May 13, 2013, XP012172981, p. 1, right-hand column—p. 2, paragraph 3; figure 1.

Extended European Search Report dated Sep. 10, 2021, issued in corresponding EP Patent Application No. 19854795.2.

English language translation of the following: Office action dated Dec. 29, 2023 from the SIPO in a Chinese patent application No. 201980053808.7 corresponding to the instant patent application. This office action translation is submitted now in order to supplement the understanding of the cited references which are being disclosed in the instant Information Disclosure Statement.

* cited by examiner

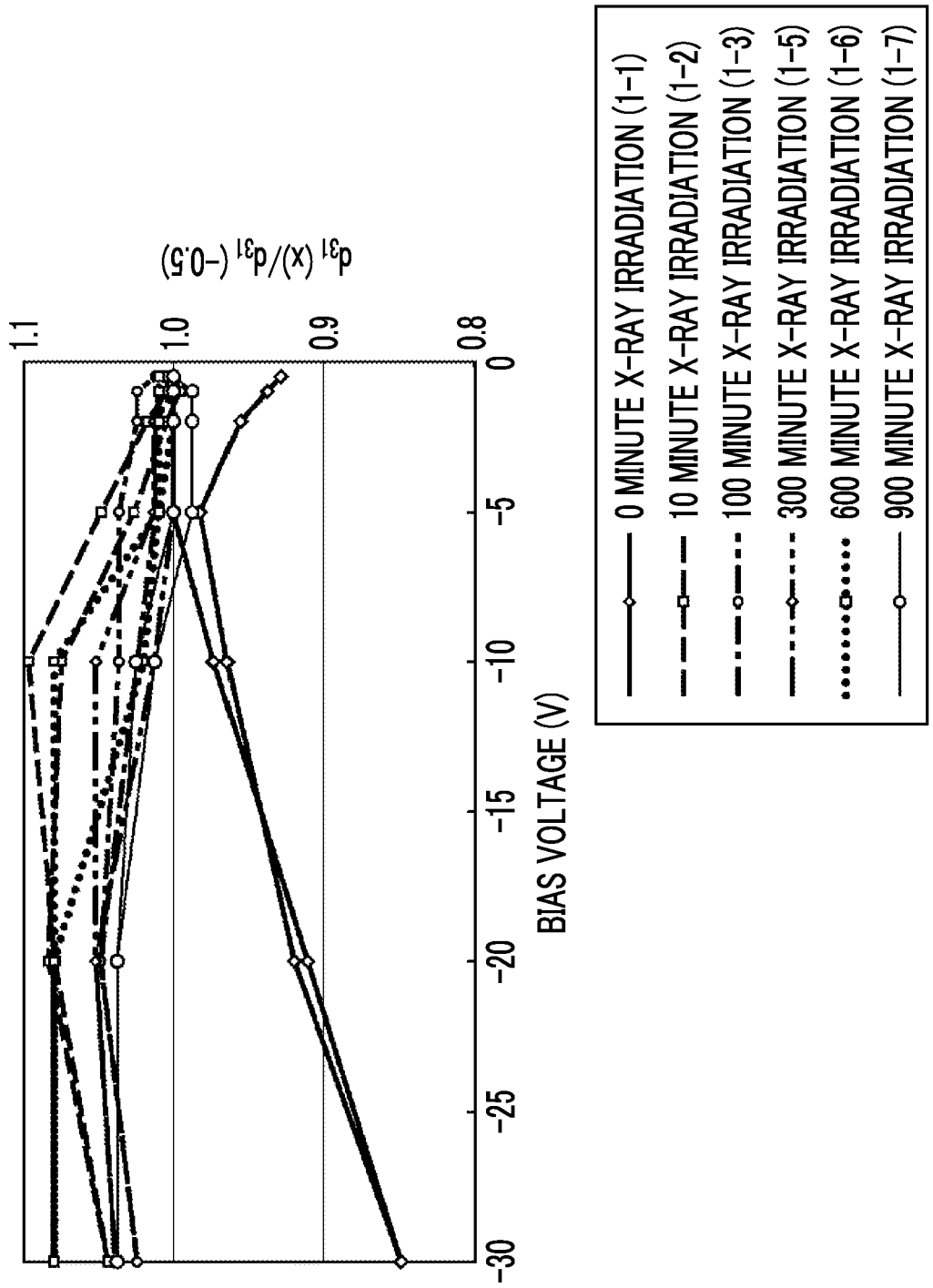

PIEZOELECTRIC DEVICE AND METHOD OF MANUFACTURING PIEZOELECTRIC DEVICE

CROSS-REFERENCE TO RELATED APPLICATIONS

This application is a continuation application of International Application No. PCT/JP2019/029890, filed Jul. 30, 2019, the disclosure of which is incorporated herein by reference in its entirety. Further, this application claims priority from Japanese Patent Application No. 2018-161453, filed Aug. 30, 2018, the disclosure of which is incorporated herein by reference in its entirety.

BACKGROUND OF THE INVENTION

1. Field of the Invention

The present disclosure relates to a piezoelectric device including a piezoelectric thin film and a manufacturing method thereof.

2. Description of the Related Art

In recent years, piezoelectric thin film devices have attracted attention due to the progress of a technology for forming a piezoelectric film. In particular, piezoelectric microelectromechanical system (MEMS) devices combined with a silicon (Si) microfabrication technology have attracted attention. For example, since microscanners are small and consumes low power, these are expected to have a wide range of applications from laser projectors to optical diagnostic scanners such as optical coherence tomography. In addition, piezoelectric gyroscope sensors are expected to consume lower power than electrostatic MEMS gyroscope sensors.

The development of a piezoelectric film having high piezoelectric performance has proceeded, and for example, JP2010-084180A realizes a piezoelectric film in which both two coercive electric fields in the hysteresis curve showing polarization-electric field characteristics are set to be on the positive electric field side by precisely controlling the composition of lead zirconate titanate. JP4114363B proposes a method in which two coercive electric fields have the same polarity due to the lamination of lead zirconate titanates having different zirconium concentrations. In these literatures, it is preferable that the two coercive electric fields have the same polarity since a piezoelectric actuator obtains a large amount of displacement in a case where driving is performed with one polarity.

As a method of manufacturing a piezoelectric film, JP2002-329844A and JP2017-045992A propose a technology for crystalliziation by irradiating an uncrystallized lead zirconate titanate precursor with energy rays such as ultraviolet rays instead of controlling the temperature.

As a piezoelectric device, there are a device which is used as a single actuator such as an inkjet head, a device which is used as a single sensor such as an acceleration pickup, and a device having functions of both an actuator and a sensor. For example, in a gyroscope sensor, a piezoelectric device generates vibration as an actuator and detects a mechanical change by a sensor electrode. In an MEMS mirror device which is used in a microscanner, a piezoelectric device detects an angle of mirror by a sensor electrode while driving the mirror as an actuator. In a piezoelectric transformer or a piezoelectric filter, a piezoelectric device converts an input electric signal into mechanical vibration by an actuator function, and converts the excited mechanical vibration into an electric signal again by a sensor electrode.

SUMMARY OF THE INVENTION

The piezoelectric MEMS device having functions of both the actuator and the sensor as described above includes, for example, an electrode for an actuator and an electrode for a sensor with respect to a common piezoelectric film.

However, in the piezoelectric film, high performance for an actuator and high performance for a sensor are not the same. Specifically, it is generally desirable for the actuator to have a large amount of displacement with respect to an applied voltage, that is, a large piezoelectric constant. The sensor preferably has small sensor noise, and it is desirable for the second to have a small dielectric loss tan S. It is thought that in a piezoelectric material such as lead zirconate titanate, in addition to a piezoelectric effect (normal electric field-induced piezoelectric strain) in which a piezoelectric body is displaced according to the voltage in a spontaneous polarization direction, high piezoelectricity (here, a large piezoelectric constant) is obtained by domain rotation (for example, 90° domain rotation in a tetragonal system) in which a spontaneous polarization axis oriented in a different direction turns in a voltage direction. That is, it is thought that higher piezoelectricity is obtained due to the presence of a fluctuation component of the polarization. Meanwhile, since the fluctuation of the piezoelectric polarization is the dielectric loss tan δ and is a sensor noise source, the fluctuation component of the polarization is preferably reduced in order to reduce the sensor noise.

It is thought that in a case where the fluctuation component of the polarization is present, the dielectric loss is increased and the sensor performance is reduced, and in a case where the fluctuation component of the polarization is suppressed and the sensor performance is increased, the domain rotation component is reduced, and thus the piezoelectric constant decreases. That is, the piezoelectric film has a problem that the actuator performance is reduced in a case where the sensor performance is increased.

As described in JP2010-084180A and JP4114363B, for example, the piezoelectric characteristics can be controlled by strictly controlling the composition of the piezoelectric film. However, it is difficult to prepare two or more piezoelectric films having different piezoelectric performances in one device in a tiny device.

The present disclosure is contrived in view of the above circumstances, and an object thereof is to provide a piezoelectric device which is easily manufactured and includes two or more piezoelectric element portions having different piezoelectric performances, and a manufacturing method thereof.

A specific unit for solving the problems includes the following aspects.

<1> A piezoelectric device comprising: a first piezoelectric element portion including a first piezoelectric film region and a first electrode which is in contact with the first piezoelectric film region; and a second piezoelectric element portion including a second piezoelectric film region and a second electrode which is in contact with the second piezoelectric film region, the first and second piezoelectric element portions being supported by one structure, in which the first piezoelectric film region and the second piezoelectric film region have the same cation ratio with a lead zirconate titanate-based perovskite oxide as a primary component, and the first piezoelectric film region and the second piezoelectric film region have different piezoelectric characteristics, and the first piezoelectric film region has a smaller absolute value of a piezoelectric constant $d_{31}$ and a smaller dielectric loss tan δ than the second piezoelectric film region.

<2> The piezoelectric device according to <1>, in which the first piezoelectric film region and the second piezoelectric film region are different regions in one continuous piezoelectric film.

<3> The piezoelectric device according to <2>, in which the structure has a flat surface, and the one continuous piezoelectric film is provided on the flat surface.

<4> The piezoelectric device according to <1>, in which the first piezoelectric film region is provided on a first piezoelectric film, and the second piezoelectric film region is provided on a second piezoelectric film separated from the first piezoelectric film.

<5> The piezoelectric device according to <1> or <4>, in which the structure has two surfaces having a common normal direction, the first piezoelectric element portion is provided on one of the two surfaces, and the second piezoelectric element portion is provided on the other surface.

<6> The piezoelectric device according to any one of <1> to <5>, in which a third electrode which faces the first electrode with the first piezoelectric film region interposed therebetween, and a fourth electrode which faces the second electrode with the second piezoelectric film region interposed therebetween are provided, or a common electrode having a first electrode region which faces the first electrode with the first piezoelectric film region interposed therebetween and a second electrode region which faces the second electrode with the second piezoelectric film region interposed therebetween is provided.

<7> The piezoelectric device according to any one of <1> to <6>, further comprising a circuit which causes the first piezoelectric element portion to function as a sensor and the second piezoelectric element portion to function as an actuator.

<8> The piezoelectric device according to any one of <1> to <7>, in which each of the first piezoelectric film region and the second piezoelectric film region has ferroelectric hysteresis characteristics and two coercive electric fields, and a positive coercive electric field and a negative coercive electric field of the first piezoelectric film region have the same polarity.

<9> The piezoelectric device according to any one of <1> to <8>, in which a rate of change of a piezoelectric constant with respect to a bias voltage in the first piezoelectric film region is smaller than that in the second piezoelectric film region.

<10> The piezoelectric device according to any one of <1> to <9>, in which the lead zirconate titanate-based perovskite oxide is represented by $Pb(Zr_y,Ti_z,D_{1-y-z})O_3$, and the D element is at least one of V, Nb, Ta, Sb, Mo, or W.

<11> The piezoelectric device according to <10>, in which the D element is Nb.

<12> A method of manufacturing a piezoelectric device, the method comprising: forming a piezoelectric film formed of a thin film of a lead zirconate titanate-based perovskite oxide on a substrate; and irradiating at least a first region out of the first region and a second region of the piezoelectric film with electromagnetic waves having a wavelength of 230 nm or less in a reducing atmosphere to provide a difference in piezoelectric characteristics between the first region and the second region so that the first region has a smaller absolute value of a piezoelectric constant $d_{31}$ and a smaller dielectric loss tan δ than the second region.

<13> The method of manufacturing a piezoelectric device according to <12>, in which in a case where both the first region and the second region are irradiated with the electromagnetic waves, an irradiation dose to the first region is set to be larger than that to the second region.

<14> The method of manufacturing a piezoelectric device according to <12> or <13>, in which the electromagnetic waves have a wavelength of 190 nm or less.

According to the present disclosure, it is possible to provide a piezoelectric device which is easily manufactured and has two or more piezoelectric element portions having different piezoelectric performances, and a manufacturing method thereof.

BRIEF DESCRIPTION OF THE DRAWINGS

FIG. 11 is a diagram in which the vertical axis in FIG. 10 is normalized by a piezoelectric constant at a bias voltage of −0.5 V.

DESCRIPTION OF THE PREFERRED EMBODIMENTS

In a piezoelectric device according to an embodiment of the present disclosure, a first piezoelectric element portion including a first piezoelectric film region and a first electrode which is in contact with the first piezoelectric film region, and a second piezoelectric element portion including a second piezoelectric film region and a second electrode which is in contact with the second piezoelectric film region are supported by one structure. The first piezoelectric film region and the second piezoelectric film region have the same cation ratio with a lead zirconate titanate-based perovskite oxide as a primary component. The first piezoelectric film region and the second piezoelectric film region have different piezoelectric characteristics, and the first piezoelectric film region has a smaller absolute value of a piezoelectric constant $d_{31}$ and a smaller dielectric loss tan δ than the second piezoelectric film region.

Hereinafter, specific embodiments will be described in detail with reference to the drawings.

Figure 1:
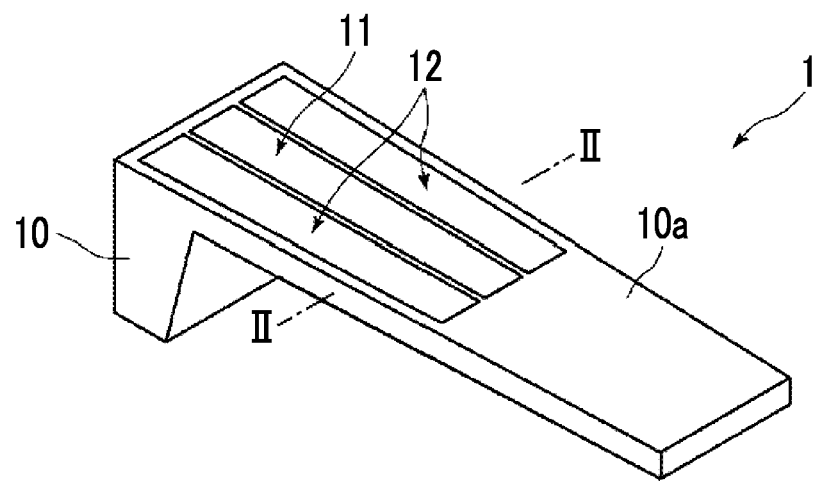
FIG. 1 is a perspective view of a piezoelectric device according to a first embodiment of the invention.
Figure 2:
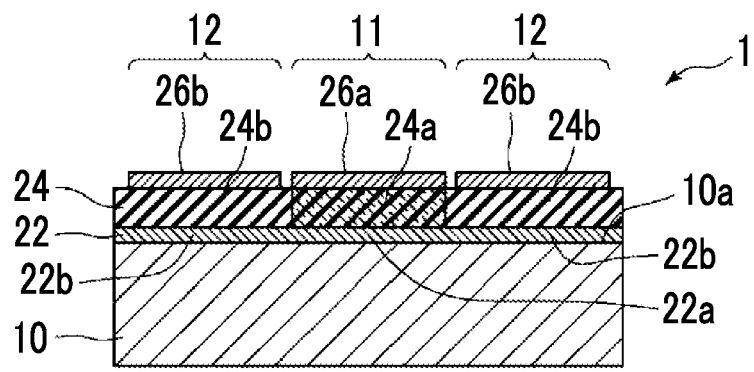
FIG. 2 is a cross-sectional view taken along the line II-II of the piezoelectric device shown in FIG. 1.

FIG. 1 is a perspective view of a cantilever which is a piezoelectric device 1 according to an embodiment of the invention, and FIG. 2 is an end view taken along the line II-II of FIG. 1. For easy visual recognition, a film thickness and a ratio of each layer are appropriately changed and drawn, and do not necessarily reflect the actual film thickness and ratio. These are the same in the following drawings.

In the piezoelectric device 1 according to this embodiment, a first piezoelectric element portion 11 and a second piezoelectric element portion 12 are supported on one structure 10. Here, two second piezoelectric element portions 12 and one first piezoelectric element portion 11 are provided in parallel in a longitudinal direction of the structure 10. The second piezoelectric element portion 12 functions as an actuator to generate vibration. The first piezoelectric element portion 11 functions as a sensor to detect vibration. In general, the piezoelectric device, particularly a piezoelectric MEMS device has a size of about 100 µm to 10 mm in length and width. However, the device may have a smaller or larger structure, and is not particularly limited. The thickness is generally about 10 µm to 1 mm, but it is not particularly limited as long as the device can be produced.

The structure 10 is, for example, a substrate (hereinafter, referred to as the substrate 10) having a flat surface 10a. Here, the flat surface means a surface which has no step so that in a case where a thin film is formed on the surface, the film is formed into one continuous film.

The piezoelectric device 1 includes a common electrode 22 as a lower electrode on the flat surface 10a of the substrate 10, and a continuous piezoelectric film 24 continuously formed on the common electrode 22. The piezoelectric film 24 is provided with a first piezoelectric film region 24a and a second piezoelectric film region 24b. That is, the first piezoelectric film region 24a and the second piezoelectric film region 24b are different regions in one continuous piezoelectric film 24. A first electrode 26a and a second electrode 26b as upper electrodes are provided on the first piezoelectric film region 24a and the second piezoelectric film region 24b, respectively.

That is, the first piezoelectric element portion 11 includes the first piezoelectric film region 24a, the first electrode 26a as an upper electrode which is in contact with the first piezoelectric film region 24a, and a first electrode region 22a of the common electrode 22 as a lower electrode which faces the first electrode 26a with the first piezoelectric film region 24a interposed therebetween. The second piezoelectric element portion 12 includes the second piezoelectric film region 24b, the second electrode 26b as an upper electrode which is in contact with the second piezoelectric film region 24b, and a second electrode region 22b of the common electrode 22 as a lower electrode which faces the second electrode 26b with the second piezoelectric film region 24b interposed therebetween.

As for the term lower and the term upper in the lower electrode and the upper electrode, the electrodes do not mean upper and lower electrodes in a vertical direction. An electrode on the substrate side of the piezoelectric film is called the lower electrode, and an electrode facing the lower electrode with the piezoelectric film interposed therebetween is called the upper electrode.

The piezoelectric film 24 is formed as a single film. That is, each of the first piezoelectric film region 24a and the second piezoelectric film region 24b is a part of the piezoelectric film formed using the same raw material under the same conditions. Accordingly, the first piezoelectric film region 24a and the second piezoelectric film region 24b have the same cation ratio with a lead zirconate titanate-based perovskite oxide as a primary component. Here, regarding the cation ratio, a manufacturing error during film formation is included in the same range. Regarding each element constituting an A-site and a B-site in a perovskite structure to be described later, in a case where a molar ratio of each element normalized on the assumption that the sum of molar ratios of B-site elements is 1 (hereinafter, referred to as "normalized molar ratio") is within a range of ±3% of a normalized molar ratio of the same element in the second piezoelectric film region, these are regarded to be within the same range.

Since the piezoelectric film 24 is formed as a single film, the film thickness thereof is usually the same (here, a range of ±3% is regarded to be the same based on the film thickness of the second piezoelectric film region). However, the film thickness can be appropriately adjusted by etching after film formation. Therefore, a configuration in which one or both of the films of the piezoelectric film regions 24a and 24b are etched depending on the use of each region, and the first piezoelectric film region 24a and the second piezoelectric film region 24b have different film thicknesses may be employed.

The first piezoelectric film region 24a and the second piezoelectric film region 24b have different piezoelectric characteristics. The first piezoelectric film region 24a has a smaller absolute value of the piezoelectric constant $d_{31}$ and a smaller dielectric loss tan δ than the second piezoelectric film region 24b. In the following description, the magnitude of the piezoelectric constant $d_{31}$ is the magnitude of the absolute value of the piezoelectric constant.

Figure 3:
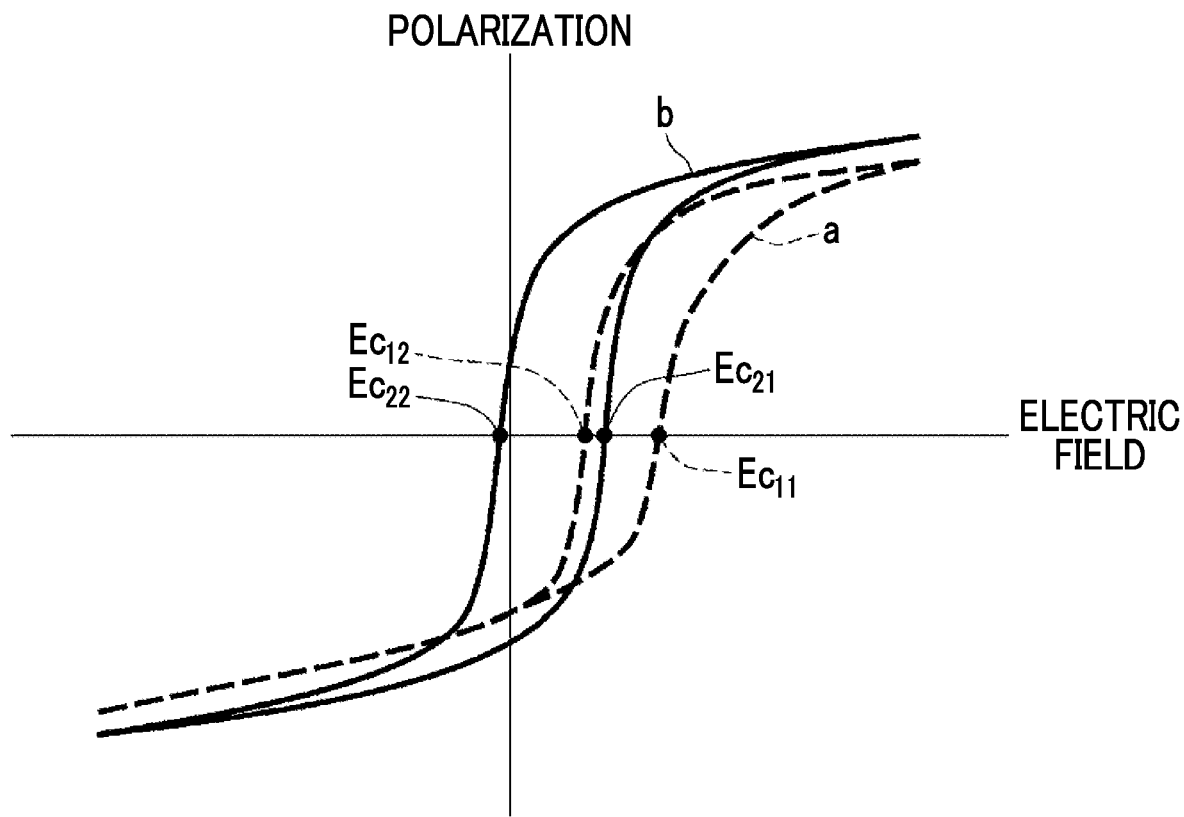
FIG. 3 is a diagram showing hysteresis characteristics showing differences in characteristics between a first piezoelectric element portion and a second piezoelectric element portion.

FIG. 3 shows an example of hysteresis curves of polarization-electric field characteristics of the first piezoelectric film region 24a and the second piezoelectric film region 24b. In FIG. 3, the hysteresis curves of the first piezoelectric film region 24a are shown by broken lines a, and the hysteresis curves of the second piezoelectric film region 24b are shown by solid lines b.

As shown in FIG. 3, two coercive electric fields $E_{c11}$ and $E_{c12}$ of the first piezoelectric film region 24a have the same polarity, and both are positioned on the positive electric field side. Here, of the two coercive electric fields $E_{c11}$ and $E_{c12}$, the coercive electric field $E_{c11}$ on the right side in the drawing is a positive coercive electric field, and the coercive electric field $E_{c12}$ on the left side in the drawing is a negative coercive electric field. Therefore, the polarization-electric field characteristics with small or no history are shown near the electric field 0 used as a sensor. This means that there is no fluctuation of the polarization fluctuation near the electric field 0 and the dielectric loss tan δ is small. Two coercive electric fields $E_{c21}$ and $E_{c22}$ of the second piezoelectric film region 24b are positioned on the positive electric field side and on the negative electric field side with the electric field 0 interposed therebetween, respectively. Here, of the two coercive electric fields $E_{c21}$ and $E_{c22}$, the coercive electric field $E_{c21}$ on the right side in the drawing is a positive coercive electric field, and the coercive electric field $E_{c22}$ on the left side in the drawing is a negative coercive electric field. However, the second piezoelectric film region 24b has a larger piezoelectric constant $d_{31}$ than the first piezoelectric film region 24a.

Figure 4:
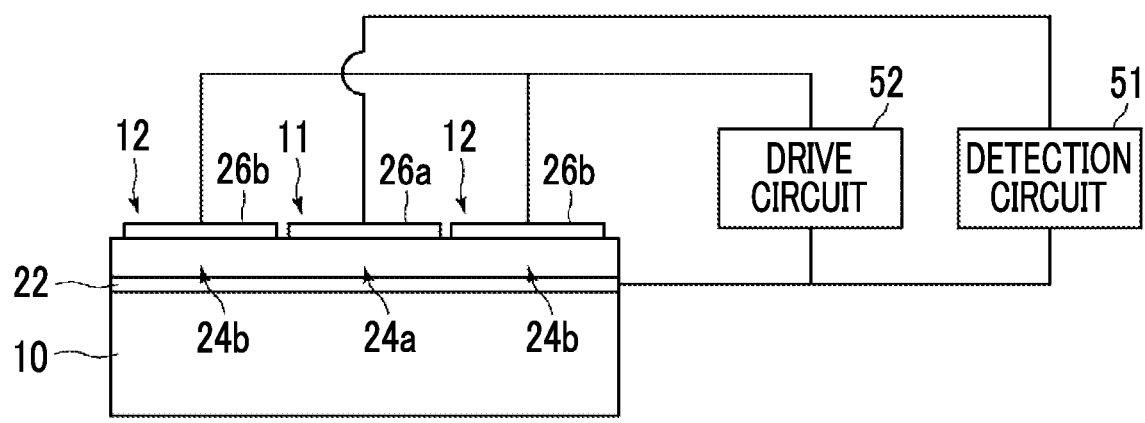
FIG. 4 is a diagram showing a schematic configuration of a piezoelectric device including a drive circuit and a detection circuit.

Therefore, the first piezoelectric element portion 11 is suitable for a sensor, and the second piezoelectric element portion 12 is suitable for an actuator. In the piezoelectric device 1, in a case where the first piezoelectric element portion 11 is used as a sensor and the second piezoelectric element portion is used as an actuator, the first piezoelectric element portion 11 may be connected to a detection circuit 51 and the second piezoelectric element portion 12 may be connected to a drive circuit 52 as shown in FIG. 4. Known circuit configurations can be appropriately used for the detection circuit 51 and the drive circuit 52.

The piezoelectric constant $d_{31}$ can be evaluated by a value measured according to the method described in Sensor and Actuator, I. Kanno et. al., A107 (2003), 68. The piezoelectric constant $d_{31}$ of the first piezoelectric film region and the piezoelectric constant $d_{31}$ of the second piezoelectric film region are regarded to be different in a case where there is a difference of 10% or more between absolute values thereof. Here, in obtaining the difference between the piezoelectric constants, the piezoelectric constant $d_{31}$ of the second piezoelectric film region is used as a reference.

The dielectric loss (tan δ) can be obtained by measuring the impedance between the upper and lower electrodes. The first piezoelectric film region and the second piezoelectric film region are regarded to have different characteristics in a case where there is a difference of 10% or more between the dielectric loss of the first piezoelectric film region and the dielectric loss of the second piezoelectric film region. Here, in obtaining the difference in the dielectric loss, the dielectric loss of the second piezoelectric film region is used as a reference.

Figure 5:
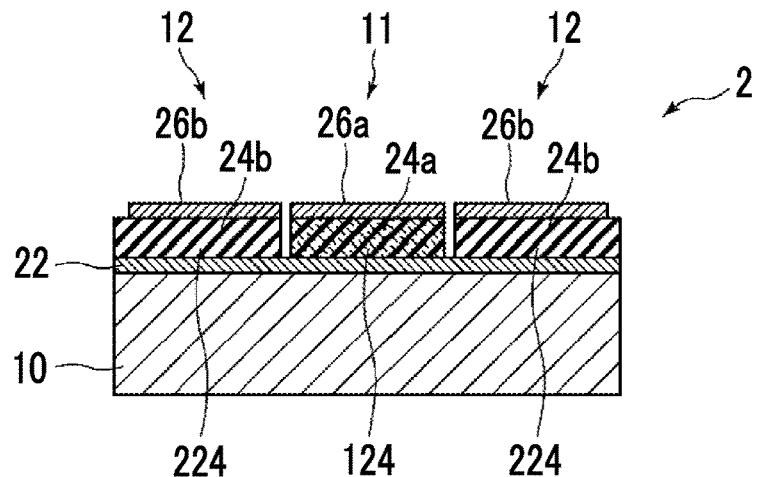
FIG. 5 is a cross-sectional view of a piezoelectric device of Design Modification 1.

The first piezoelectric film region and the second piezoelectric film region may not be regions of one continuous piezoelectric film. As in a piezoelectric device 2 of Design Modification 1 shown in FIG. 5, a first piezoelectric film region 24a may be provided on a first piezoelectric film 124, and a second piezoelectric film region 24b may be provided on a second piezoelectric film 224 separated from the first piezoelectric film 124. The first piezoelectric film 124 and the second piezoelectric film 224 are simultaneously formed, and have the same cation ratio. The first piezoelectric film 124 and the second piezoelectric film 224 may be formed by, for example, using a mask having an opening in each region, or performing etching or the like for division after formation of a single film.

In the above-described piezoelectric device 1, the lower electrode is the common electrode 22, but the lower electrode may be an individual electrode. In a case where the lower electrode is an individual electrode, the upper electrode may act as a common electrode. That is, at least one of the lower electrode or the upper electrode may be an individual electrode, or both the lower electrode and the upper electrode may be individual electrodes.

The structure is not limited to a structure having a flat surface, and may have a step on the surface. As in a structure 110 of a piezoelectric device 3 of Design Modification 2 shown in FIG. 6, the structure may have two or more surfaces 110a and 110b having a common normal direction. In this case, a configuration in which a first piezoelectric element portion 11 is provided on one surface 110a and a second piezoelectric element portion 12 is provided on one other surface 110b may be employed.

Figure 6:
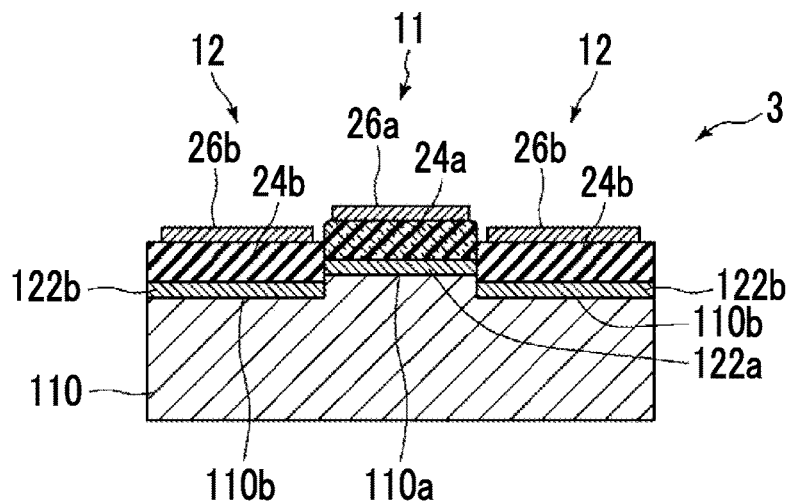
FIG. 6 is a cross-sectional view of a piezoelectric device of Design Modification 2.

In the piezoelectric device 3 shown in FIG. 6, the first piezoelectric element portion 11 includes a first piezoelectric film region 24a, a first electrode 26a as an upper electrode, and a third electrode 122a as a lower electrode which faces the first electrode 26a with the first piezoelectric film region 24a interposed therebetween. The second piezoelectric element portion 12 includes a second piezoelectric film region 24b, a second electrode 26b as an upper electrode, and a fourth electrode 122b as a lower electrode which faces the second electrode 26b with the second piezoelectric film region 24b interposed therebetween. By sequentially forming the lower electrodes, the piezoelectric films, and the upper electrodes on the surface having a step as in the structure 110, the lower electrodes may be formed on the surfaces 110a and 110b with a step therebetween as the individual third and fourth electrodes 122a and 122b so that a step may be formed at the positions of the corresponding electrodes or piezoelectric films of the first piezoelectric element portion 11 and the second piezoelectric element portion 12. The third electrode 122a and the fourth electrode 122b may be formed by, for example, using a mask having an opening in each region, or performing etching or the like for division in a process after formation of a single film.

In any case, the piezoelectric film of the first piezoelectric element portion 11 and the piezoelectric film of the second piezoelectric element portion 12 are simultaneously formed under the same conditions. These are not combined after being individually formed. However, the first piezoelectric film region 24a has a smaller piezoelectric constant $d_{31}$ and a smaller dielectric loss tan δ than the second piezoelectric film region 24b. Although details will be described later, the first piezoelectric film region 24a of the first piezoelectric element portion 11 is irradiated with electromagnetic waves having a wavelength of 230 nm or less after formation of the piezoelectric film 24, and thus has different piezoelectric characteristics from the second piezoelectric film region 24b of the second piezoelectric element portion 12.

Figure 7:
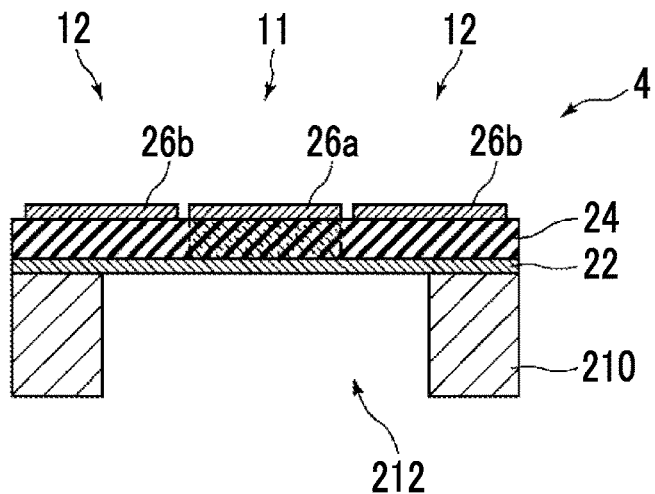
FIG. 7 is a cross-sectional view of a piezoelectric device according to a second embodiment.

Since the above-described piezoelectric device 1 is a cantilever, it is provided with the structure 10 having a rectangular plate-shaped portion. However, the shape of the structure is appropriately determined depending on the use of the piezoelectric device. For example, as in a piezoelectric device 4 according to a second embodiment shown in FIG. 7, a structure 210 having a cavity portion 212 on the side of a common electrode 22 as a lower electrode of a first piezoelectric element portion 11 and a second piezoelectric element portion 12 may be provided. As above, the piezoelectric device may be configured so that a part of the common electrode 22 is exposed in the cavity portion 212 of the structure 210.

The respective components of the piezoelectric device will be described.

The material for the structure is not limited, and examples thereof include substrates such as silicon, glass, stainless steel, yttrium-stabilized zirconia (YSZ), alumina, sapphire, and silicon carbide. A laminate substrate such as a silicon-on-insulator (SOI) substrate may be used.

The thickness of each of the lower electrode and the upper electrode is not particularly limited, and is, for example, about 200 nm. The thickness of the piezoelectric film is not particularly limited as long as it is 10 μm or less. Usually, the thickness is 1 μm or more, and for example, 1 to 5 μm. The method of forming the lower electrode, the upper electrode, and the piezoelectric film is not particularly limited. A vapor growth method is preferable, and a sputtering method is particularly preferable.

The primary component of the lower electrode is not particularly limited, and examples thereof include a metal or metal oxide such as Au, Pt, Ir, $IrO_2$, $RuO_2$, $LaNiO_3$, and $SrRuO_3$, and combinations thereof.

The primary component of the upper electrode is not particularly limited, and examples thereof include the materials exemplified for the lower electrode, electrode materials such as Al, Ti, Ta, Cr, and Cu which are generally used in semiconductor processes, and combinations thereof.

The piezoelectric film contains a lead zirconate titanate-based (hereinafter, referred to as PZT-based) perovskite oxide as a primary component. In this specification, the primary component means a component which accounts for 80 mol % or more of constituent components. The piezoelectric film 24 preferably contains a PZT-based perovskite oxide in an amount of 90 mol % or more, and more preferably 95 mol % or more. Whether the primary component of the piezoelectric film 24 is a PZT-based perovskite oxide can be confirmed by measuring an X-ray diffraction (XRD) profile. In a case where with respect to a peak of the PZT-based perovskite, peaks of other structures such as a pyrochlore structure are 5% or less, the PZT-based perovskite can be said to be a primary component. In the XRD profile, the maximum peak of other structures is preferably 2% or less, and more preferably 1% or less of the maximum peak of the perovskite. It is particularly preferable that a peak of a structure other than the perovskite is not observed.

The PZT-based perovskite oxide may include not only so-called intrinsic PZT (lead zirconate titanate) represented by $Pb(Zr,Ti)O_3$ but also oxides in which the A-site and/or the B-site are doped with other ions to the extent that the perovskite structure generally represented by $ABO_3$ can be maintained. The PZT-based perovskite oxide is preferably represented by $Pb(Zr_y,Ti_z,D_{1-y-z})O_3$, where $0<y<1$, $0<z<1$. In the B-site, $Zr^{4+}$ and $Ti^{4+}$ are preferably substituted with high-valent ions, and specific examples of the D element include pentavalent V, Nb, Ta, and Sb and hexavalent Mo and W. Nb is particularly preferable as the D element. In $Pb(Zr_y,Ti_z,D_{1-y-z})O_3$, a molar ratio of Pb:(Zr+Ti+D):D is generally 1:1:3 as a standard, but may deviate within a range in which the perovskite structure can be provided.

The same cation ratio means that the normalized molar ratios of the respective elements represented by Pb/(Zr+Ti+D), Zr/(Zr+Ti+D), Ti/(Zr+Ti+D), and D/(Zr+Ti+D) are the same. In a case where the normalized molar ratio in the second piezoelectric film region is set to 1, and the normalized molar ratio in the first piezoelectric film region is in a range of 1±3%, that is, in a range of 0.97 to 1.03, these are considered to be the same.

Regarding the polarization-electric field hysteresis characteristics of a normal piezoelectric film, a right coercive electric field is a positive electric field and a left coercive electric field is a negative electric field with 0 kV/cm as a boundary, and the absolute values thereof are generally close to each other. That is, a polarization-electric field hysteresis curve of a normal piezoelectric film, for example, intrinsic PZT or the like is a point-symmetrical figure with respect to the electric field 0. In such a normal piezoelectric film, upward polarization and downward polarization occur with the same probability, and thus an operation of applying a high electric field to the sample to achieve polarization alignment in one direction, which is called a polarization process (polling process).

In PZT (hereinafter, referred to as doped PZT) in which in the B-site, ions having higher valence than $Zr^{4+}$ and $Ti^{4+}$ (hereinafter, referred to as donor ions) are added, in a case where the composition is adjusted so that the lower electrode is a ground electrode, a hysteresis curve shifted to the right, that is, the positive electric field side, or a hysteresis curve shifted to the left, that is, the negative electric field side can be obtained. In a piezoelectric element having the same configuration, in a case where the upper electrode is a ground electrode, the shift direction of the hysteresis curve is reversed. FIG. 3 described above is an example in which the hysteresis curve is shifted to the positive electric field side. In the doped PZT film, since the polarization in one direction is stable, a high piezoelectric performance can be obtained without the polarization process. In the doped PZT film, polarization in a direction from the lower electrode side toward the upper electrode side is stable. The reason for this is thought to be that defect polarization (defect dipole) occurs by the donor ion and the point defect. Since no polarization process is required for the doped PZT film, the manufacturing process can be simplified, there is no concern that the sample may be destroyed by the high electric field during the polarization process, and wiring for polarization is not required, whereby there is a merit that the number of elements which can be produced from one wafer can be increased.

Even in the doped PZT film, the polarization is not completely aligned in one direction, and unstable polarization (fluctuation component of polarization) exists at a certain ratio. However, due to the unstable polarization, the doped PZT film can obtain a high piezoelectric constant. In contrast, due to this fluctuation component, the dielectric loss is also increased. In a method of manufacturing a piezoelectric device to be described later, the defect is introduced near the surface even in a normal film such as an intrinsic PZT film whose characteristics are symmetrical, and thus the polarization in one direction is stabilized, and a dielectric loss reduction effect is obtained. The above method is remarkably effective for a doped PZT film to which donor ions containing a large amount of the fluctuation component are added. The effect is more remarkably exhibited in an Nb-doped PZT film having high piezoelectricity.

Here, the piezoelectric film does not necessarily satisfy Pb/(Zr+Ti)=1 even in a case where it is an intrinsic PZT film. Pb/(Zr+Ti) may be larger or smaller than 1. Pb has been known to be able to also take 4+ valence, and there may be a case where a perovskite structure with $Pb^{4+}$ solid-solubilized in Zr, Ti sites, represented by the chemical formula $Pb(Zr_x,Ti_{1-x})O_3+PbPbO_3$, is provided. In addition, since the insulating property is maintained even in a case where donor ions such as Nb are substituted, a piezoelectric film represented by the chemical formula $Pb_{1-y/2}(Zr_x,Ti_{1-x})_yD_{1-y}O_3$ accompanied by lead defect or the chemical formula $Pb_{1-y/2}(Zr_x,Ti_{1-x})_yD_{1-y}O_3+PbPbO_3$ can also be obtained. That is, Pb/(Zr+Ti+D) is a value near 1, but is not necessarily 1. There may also be a case where $Pb_{1-\delta}(Zr,Ti)O_{3-\delta}$ with Pb and O missing as a set is provided. There may also be a case where there is no problem in practical use although the valence is slightly shifted and electrons and holes are supplied. That is, in this specification, the PZT-based perovskite oxide is not limited to those with a perfect balance of valence (electroneutrality condition is satisfied).

Figure 8:
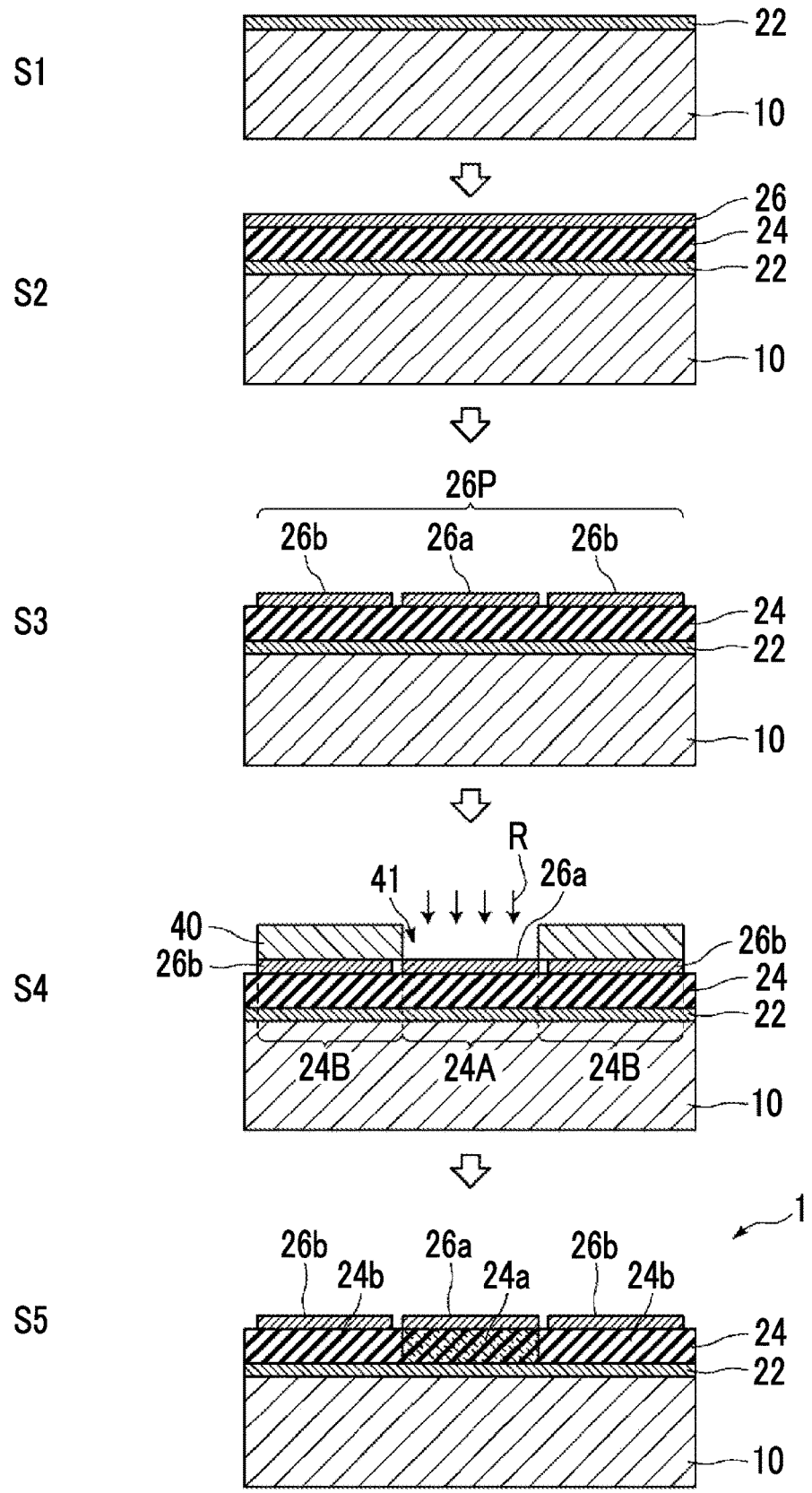
FIG. 8 is a diagram showing an example of a manufacturing process of a piezoelectric device.

Next, an embodiment of the method of manufacturing a piezoelectric device according to the embodiment of the invention will be described. Here, a manufacturing process for the piezoelectric device 1 shown in FIGS. 1 and 2 will be described. FIG. 8 is a diagram showing the manufacturing process for the piezoelectric device 1.

First, a substrate 10 constituting a structure is prepared, and a common electrode 22 as a lower electrode is formed on a surface of the substrate 10 by a sputtering method (S1).

Next, a piezoelectric film 24 formed of a PZT-based perovskite oxide is formed on the common electrode 22 by a sputtering method, and an electrode layer 26 to be an upper electrode is further formed on the piezoelectric film 24 (S2).

Then, the electrode layer 26 is patterned by lithography and etching to form a patterned electrode layer 26P including a first electrode 26a and a second electrode 26b (S3). In this case, electrode wiring (not shown) may be simultaneously formed.

Then, a mask 40 formed of a 2 mm-thick aluminum plate having an opening 41 with a desired shape is installed on the patterned electrode layer 26P and irradiated with electromagnetic waves R having a wavelength of 230 nm or less under a reducing atmosphere (S4). The first electrode 26a exposed to the opening 41 is irradiated with the electromagnetic waves R so that the waves are transmitted through the first electrode 26a and applied to a first region 24A of the piezoelectric film 24. In this case, a second region 24B corresponding to a region covered by the mask 40 in the piezoelectric film 24 is not irradiated with the electromagnetic waves R. The electromagnetic waves R may have a wavelength of 230 nm or less, and the wavelength is preferably 210 nm or less, and more preferably 190 nm or less. The electromagnetic waves may be any one of ultraviolet light, X-rays, γ-rays, or the like as long as the wavelength thereof is 230 nm or less. The lower limit wavelength of the electromagnetic waves R is not particularly limited, and may be, for example, 0.05 nm. The electromagnetic waves R are appropriately selected within such a range that there is no change in the cation ratios of the first piezoelectric film region and the second piezoelectric film region due to the irradiation. Regarding the thickness and the material of the mask 40, the mask is not limited to the 2 mm aluminum plate as long as a shielding effect is achieved against the electromagnetic waves R. Although the electromagnetic waves R are applied via the first electrode 26a, the electromagnetic waves R may be directly applied to the first region 24A of the piezoelectric film 24 before the formation of the electrode layer 26. In particular, in a case where ultraviolet light having low energy is used as the electromagnetic waves R, it is preferable that the mask 40 is installed on the piezoelectric film before the formation of the electrode layer 26 to directly apply the electromagnetic waves R to the first region 24A without the irradiation on the second region 24B.

Due to the irradiation of the electromagnetic waves R, the first region 24A (hereinafter, the first piezoelectric film region 24a) of the piezoelectric film 24 has different piezoelectric characteristics from the second region 24B (hereinafter, the second piezoelectric film region 24b) that has not been irradiated with the electromagnetic waves R, whereby it is possible to manufacture a piezoelectric device 1 including a first piezoelectric element portion 11 and a second piezoelectric element portion 12 having different piezoelectric characteristics (S5).

Due to the irradiation of the electromagnetic waves R, the first piezoelectric film region 24a has a smaller piezoelectric constant $d_{31}$ and a smaller dielectric loss tan δ than the second piezoelectric film region 24b. The reason for this is not clear, but is presumed that the irradiation of the electromagnetic waves R causes oxygen defects on the surface of the piezoelectric film, and due to the oxygen defects, the fluctuation component of the polarization is reduced and the piezoelectric characteristics are thus changed. According to the study conducted by the inventors, the amount of the oxygen defects caused by the irradiation of the electromagnetic waves R is undetectable even by acquiring the oxygen profile and each cation profile in the film thickness direction by dynamic-secondary ion mass spectrometry (d-SIMS).

Here, the reducing atmosphere means an atmosphere having a higher reducing property than in the air, such as a nitrogen atmosphere or a vacuum. It is thought that by irradiating the piezoelectric film with strong energy rays in the reducing atmosphere, the oxygen near the surface of the piezoelectric film is deprived and oxygen defects are thus generated. It is thought that by increasing the sample temperature to a high temperature and applying the electromagnetic waves R, and by applying the electromagnetic waves under a mixed gas of argon (Ar) and hydrogen or a mixed gas of nitrogen and hydrogen, the oxygen defects can be efficiently generated, and the effect of changing the piezoelectric characteristics can be improved.

It is thought that since oxygen which is a negative ion is missed at the surface of the piezoelectric film, the portion with no missing oxygen has a positive charge, and since at least a part of the polarization which is a fluctuation component in the absence of the defect is stabilized in a direction toward the positive charge generated by the missing.

In the above-described embodiments, the first region is irradiated with the electromagnetic waves R, and the second region is irradiated with no electromagnetic waves. However, both the regions may be irradiated with the electromagnetic waves, and an irradiation dose to the first region may be set to be larger than that to the second region to form regions having different piezoelectric characteristics. Here, the irradiation dose is the irradiation energy quantity. The smaller the wavelength, the larger the energy quantity. In addition, in a case where the electromagnetic waves have the same wavelength, the longer the irradiation time, the larger the energy quantity. The larger the electromagnetic wave irradiation dose, the more the oxygen vacancies, that tend to lead to a reduction of the fluctuation component (see the demonstration test to be described later). In this manner, the piezoelectric characteristics can be controlled by controlling the electromagnetic wave irradiation dose to the piezoelectric film.

Since the piezoelectric characteristics of the piezoelectric film can be changed only by irradiation with electromagnetic waves having a wavelength of 230 nm or less, piezoelectric film regions having different piezoelectric characteristics can be very easily formed in the piezoelectric film formed in one film forming process. Accordingly, it is possible to easily manufacture the piezoelectric device including the first and second piezoelectric elements according to the embodiment of the invention with low cost. According to this manufacturing method, it is possible to easily provide piezoelectric film regions having different piezoelectric characteristics in a tiny device such as a MEMS device.

In addition to the first piezoelectric element and the second piezoelectric element, a third piezoelectric element including a third piezoelectric film region having different piezoelectric characteristics, that is, a different piezoelectric constant and a different dielectric loss from the first piezoelectric film region and the second piezoelectric film region may be included. According to the above-described manufacturing method, it is possible to easily form a desired number of piezoelectric film regions having different piezoelectric characteristics in the piezoelectric film, and thus it is also possible to manufacture a piezoelectric device including three or more piezoelectric elements having different piezoelectric constants and different dielectric losses.

In the above description, the case where one of the first piezoelectric element and the second piezoelectric element of the piezoelectric device functions as a sensor and the other functions as an actuator has been described. However, in the piezoelectric device including the first piezoelectric element and the second piezoelectric element having different piezoelectric characteristics, both the elements may be used as actuators or sensors.

For example, a piezoelectric device may be produced in which a first piezoelectric element which has good linearity with a small voltage is used as an actuator for driving with high accuracy and a second piezoelectric element which is largely displaced with a small voltage although the linearity thereof is low is used as an actuator for obtaining a large drive force. Otherwise, a piezoelectric device may be produced in which a first piezoelectric element is used as a sensitivity-oriented sensor which detects slight vibration and a second piezoelectric element is used as a sensor which detects how much the vibration is when the vibration is large.

Hereinafter, the results of demonstration: by irradiating a piezoelectric film formed of a PZT-based perovskite oxide with electromagnetic waves having a wavelength of 230 nm or less, piezoelectric characteristics can be changed, and a piezoelectric device including regions having different piezoelectric characteristics can be realized will be described.

(Demonstration Test 1)

A laminate electrode of Ti (20 nm)/Ir (150 nm) was formed on a 625 μm-thick Si substrate coated with a thermally oxidized film of 300 nm by sputtering to prepare a lower electrode. On the lower electrode substrate, a lead zirconate titanate-based piezoelectric film (hereinafter, referred to as a PZT film) was formed by sputtering $Pb_{1.3}((Zr_{0.52},Ti_{0.48})_{0.88},Nb_{0.12})O_3$ as a raw material target under conditions of a high-frequency power density of 4.4 W/cm², a degree of vacuum of 0.5 Pa, an $Ar/O_2$ mixed atmosphere ($O_2$ volume fraction: 6.5%), and 640° C. The film forming time was appropriately adjusted by rate check in advance to obtain a 3 μm PZT film. Pb/(Zr+Ti+Nb)=1.10 and Nb/(Zr+Ti+Nb)=0.12 were obtained. The composition ratio was determined by performing fluorescent X-ray analysis. Specifically, the composition ratio was determined by composition analysis by a fundamental parameter (FP) method using, as a calibration curve, a fluorescent X-ray intensity of a sample having a composition known by inductively coupled plasma atomic emission spectrometry (ICP-AES).

After that, an upper electrode was formed by sputtering on the PZT film. A 2 mm×25 mm strip (rectangle) was cut out from the laminate in which the lower electrode, the PZT film, and the upper electrode were laminated on the substrate, and a cantilever was produced. Here, a plurality of cantilevers were produced, and then a sample 1-1 irradiated with no X-rays and samples 1-2 to 1-9 irradiated with X-rays from the upper electrode side at different irradiation times were produced. The X-ray irradiation was performed by applying the X-rays set to 60 kV and 66 mA and output from the upper electrode side using a rhodium (Rh) tubular bulb under a vacuum of about 5 to 10 Pa. The X-ray irradiation time was set to 10 minutes (sample 1-2), 100 minutes (sample 1-3), 200 minutes (sample 1-4), 300 minutes (sample 1-5), 600 minutes (sample 1-6), 900 minutes (sample 1-7), 1,200 minutes (sample 1-8), and 1,800 minutes (sample 1-9) in each case.

A piezoelectric constant $d_{31}$ of each of the samples 1-1 to 1-9 was measured. The piezoelectric constant $d_{31}$ was measured according to the method described in Sensor and Actuator A 107 (2003), I. Kanno et. al., 68. The piezoelectric constant $d_{31}$ was measured with an applied voltage obtained by adding ±0.5 V, that is, a sine voltage of 1 Vpp (pp=peak to peak) to a predetermined bias voltage (offset voltage). Unless otherwise specified, the bias voltage was −5 V in the measurement of the piezoelectric constant $d_{31}$. In the following description, the measurement with an applied voltage obtained by adding a sine voltage of 1 Vpp to a bias voltage of −5 V is "the measurement with an applied voltage of −5 V±0.5 V" or simply "the measurement with a bias voltage of −5 V". In addition, the following measurement was performed using the lower electrode as a ground electrode.

A dielectric loss (tan δ) was obtained by measuring impedance between the upper and lower electrodes. An impedance analyzer 4294A manufactured by Agilent Technologies, Inc. was used for the measurement.

Table 1 collectively shows X-ray irradiation times, absolute values of piezoelectric constants $d_{31}$, and dielectric losses tan δ of the samples 1-1 to 1-9.

TABLE 1

|  | X-Ray Irradiation Time [min] | Piezoelectric Constant $|d_{31}|$ [pm/V] | Dielectric Loss tan δ [%] |
| --- | --- | --- | --- |
| Sample 1-1 | 0 | 233 | 2.8 |
| Sample 1-2 | 10 | 184 | 1.6 |
| Sample 1-3 | 100 | 172 | 1.1 |
| Sample 1-4 | 200 | 170 | 0.90 |
| Sample 1-5 | 300 | 167 | 0.80 |
| Sample 1-6 | 600 | 159 | 0.70 |
| Sample 1-7 | 900 | 159 | 0.68 |
| Sample 1-8 | 1200 | 159 | 0.66 |
| Sample 1-9 | 1800 | 154 | 0.65 |

In the samples 1-2 to 1-9 irradiated with X-rays, it was possible to reduce the dielectric loss tan δ and the piezoelectric constant $d_{31}$ was small as compared with the sample 1-1 irradiated with no X-rays. There is a tendency that the longer the irradiation time, that is, the larger the irradiation energy quantity, the smaller the dielectric loss and the piezoelectric constant.

Figure 9:
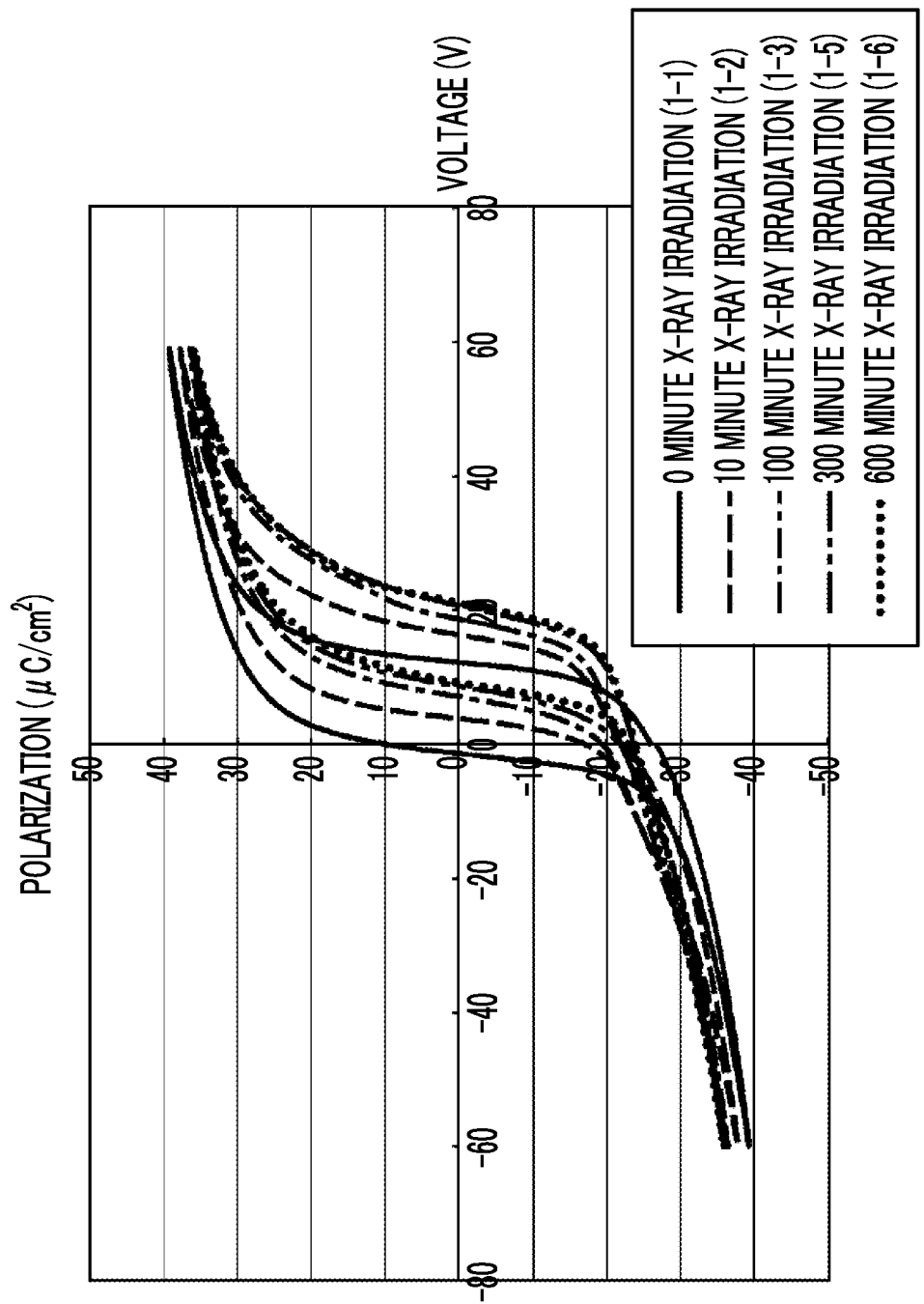
FIG. 9 is a diagram showing polarization-voltage hysteresis of samples.

The results of the measurement of polarization-voltage hysteresis performed on the samples 1-1, 1-2, 1-3, 1-5, and 1-6 are shown in FIG. 9. As shown in FIG. 9, in the samples 1-2, 1-3, 1-5, and 1-6 irradiated with X-rays, two coercive electric fields were both on the positive voltage side. The fact that the two coercive electric fields are both on the positive voltage side shows the stability of the polarization, and corresponds to the fact that the tan δ near 0 V is small. It is thought that since oxygen defects are introduced into a region on the upper electrode side in the piezoelectric film irradiated with X-rays and positive charges are accumulated, the coercive electric field is biased toward the positive voltage side. In the case of the hysteresis closer to the positive voltage side in the sample 1-1 irradiated with no X-rays in FIG. 9, the electromagnetic waves are preferably applied from the upper electrode side as in this demonstration test from the viewpoint that the polarities of the two coercive electric fields are biased to be positive, that is, have the same polarity. By appropriately adjusting the composition of lead or the like, it is also possible to form a film with hysteresis closer to the negative voltage side. In that case, the electromagnetic waves are preferably applied to the piezoelectric film from the lower electrode side from the viewpoint that the polarities of the two coercive electric fields are biased to be negative, that is, have the same polarity. In a case where the electromagnetic waves are applied from the lower electrode side, the substrate is preferably thin so as to prevent the shielding of the electromagnetic waves by the substrate.

Figure 10:
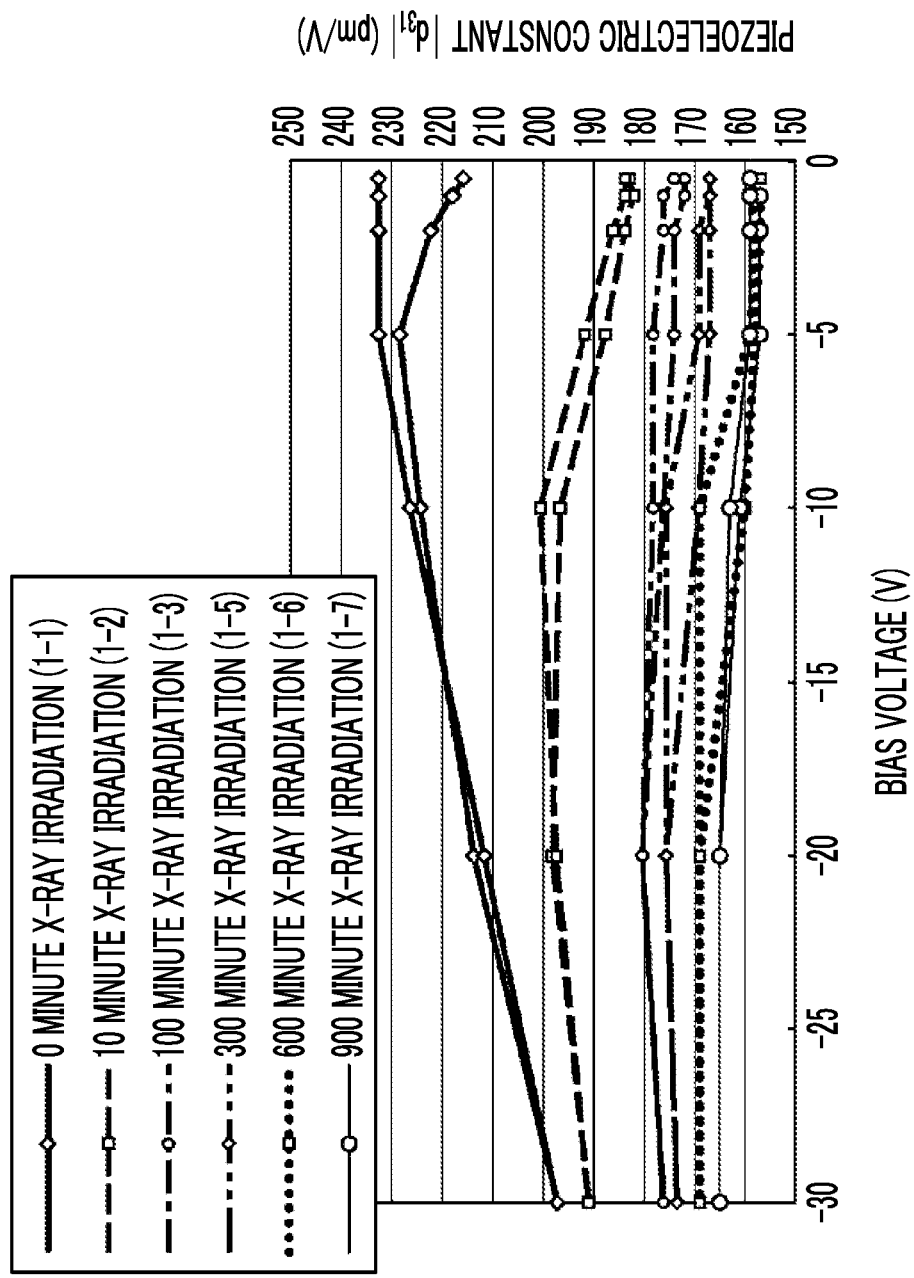
FIG. 10 is a diagram showing bias voltage dependences of piezoelectric constants of samples.

FIG. 10 shows results of examination of the bias voltage dependences of the piezoelectric constants $d_{31}$ of the samples 1-1, 1-2, 1-3, 1-5, 1-6, and 1-7. The piezoelectric constant $d_{31}$ was measured according to the method described above. In FIG. 10, for example, a bias voltage of −0.5 V means the measurement performed with an applied voltage of −0.5±0.5 V, and similarly, a bias voltage of −30 V means the measurement performed with an applied voltage of −30 V±0.5 V.

FIG. 11 is a graph in which the vertical axis in FIG. 10 is normalized by a piezoelectric constant $d_{31}$ (−0.5) at a bias voltage of −0.5 V.

As shown in FIGS. 10 and 11, in the sample 1-1 irradiated with no X-rays, the piezoelectric constant itself was large, and the change in the piezoelectric constant due to the bias voltage was also large. In contrast, the samples irradiated with X-rays for 10 minutes or longer had a smaller piezoelectric constant than the sample irradiated with no X-rays, and also had small bias voltage dependence.

In addition, in the samples irradiated with X-rays, the piezoelectric constant at a bias voltage of −0.5 V remained the same before and after application of −30 V to the sample, but in the sample 1-1, the piezoelectric constant at an applied voltage of −0.5 V was remarkably changed before and after application of −30 V to the sample. In the sample 1-1, the piezoelectric constant $d_{31}$ (−0.5) measured at a bias voltage of −0.5 V after application of −30 V was larger than that measured at a bias voltage of −0.5 V before application of −30 V. It is thought that since the direction of the polarization is further aligned by applying a large voltage, the piezoelectric performance is slightly improved in the case of the piezoelectric constant $d_{31}$ (−0.5) after application of −30 V as compared with the case of $d_{31}$ (−0.5) before application of −30 V.

It is thought that in a case where more precise driving is required, the piezoelectric element portion used as an actuator can be irradiated with X-rays for a short time to improve the linear characteristics within a range not significantly impairing the actuator performance, and the piezoelectric element portion used as a sensor can be irradiated with X-rays for a long time to reduce the tan δ. It is thought that the high piezoelectric constant of the sample irradiated with no X-rays is due to the presence of the polarization not oriented in a spontaneous polarization direction in the piezoelectric film. Accordingly, it is thought that by aligning the polarization in the spontaneous polarization direction by the X-ray irradiation, the piezoelectric constant is reduced, but the reduction of the dielectric loss and the linearity improving effect are achieved.

(Demonstration Test 2)

In a demonstration test 2, the film forming conditions for a lower electrode, a PZT film, and an upper electrode in the preparation of samples were the same as those in the demonstration experiment 1, but as the electromagnetic waves R, ultraviolet rays (UV light) were used instead of X-rays. Before formation of the upper electrode, the PZT film was directly irradiated with UV light, and the upper electrode was formed after the UV light irradiation of the PZT film. In the UV irradiation of the PZT film, a UV light irradiation region and a non-irradiation region were provided using a 2 mm-thick aluminum plate as a mask, and a shielding region shielded by the aluminum plate was changed by the UV irradiation time to form four regions formed with different UV light irradiation times. The UV light irradiation times for the four regions were set to 0 minutes, 10 minutes, 60 minutes, and 9000 minutes, respectively.

The UV light was applied using a low-pressure mercury lamp having a peak wavelength at 185 nm and 254 nm as a light source so that the energy irradiation dose on the piezoelectric film was 1.6 μW/cm². Since the energy irradiation dose per hour is constant, the total energy irradiation dose varies depending on the UV light irradiation time. In the laminate in which the lower electrode, the PZT film, and the upper electrode were laminated on the substrate as described above, a 2 mm×25 mm strip (rectangle) was cut out from each of the regions in the PZT film irradiated with UV light for different times, respectively, and a cantilever was produced. In this manner, a sample 2-1 with an UV irradiation time of 0 minutes, a sample 2-2 with an UV irradiation time of 10 minutes, a sample 2-3 with an UV irradiation time of 60 minutes, and a sample 2-4 with an UV irradiation time of 9,000 minutes were produced. The sample 2-1 with an irradiation time of 0 minutes is irradiated with no UV light, and is equivalent to the sample 1-1 in the demonstration test 1. For each sample, a piezoelectric constant and a dielectric loss were measured in the same manner as in the demonstration test 1.

Table 2 collectively shows UV light irradiation times, piezoelectric constants $d_{31}$, and dielectric losses tan δ of the samples 2-1 to 2-4.

TABLE 2

| | UV Light Irradiation Time [min] | Piezoelectric Constant $|d_{31}|$ [pm/V] | Dielectric Loss tan δ [%] |
|---|---|---|---|
| Sample 2-1 | 0 | 233 | 2.8 |
| Sample 2-2 | 10 | 154 | 1.4 |
| Sample 2-3 | 60 | 154 | 1.4 |
| Sample 2-4 | 9000 | 120 | 1.1 |

In the samples 2-2 to 2-4 irradiated with UV light, it was possible to reduce the dielectric loss tan δ and the piezoelectric constant $d_{31}$ was reduced as compared with the sample 2-1 irradiated with no UV light. There was a tendency that the longer the irradiation time, that is, the larger the irradiation energy quantity, the smaller the dielectric loss and the piezoelectric constant.

Ferroelectric hysteresis was measured in the same manner as in the demonstration test 1, and the same tendency as in the case of the X-ray irradiation was observed. That is, in all the samples 2-2 to 2-4 irradiated with UV light, two coercive electric fields were both positive coercive electric fields, and in the samples 2-2 to 2-4, the linearity of the piezoelectric constant was higher than in the sample 2-1. With the UV light, the effect of changing the piezoelectric performance was obtained as in the case of the X-rays. X-rays were more effective in reducing the dielectric loss.

The entire disclosure of JP2018-161453 filed on Aug. 30, 2018 is incorporated herein by reference.

All the literatures, patent applications, and technical standards mentioned herein are incorporated herein to the same extent as in a case where it is specifically and individually mentioned that the individual literatures, patent applications, and technical standards are incorporated herein by reference.

What is claimed is:
1. A piezoelectric device comprising:
 a first piezoelectric element portion including a first piezoelectric film region and a first electrode which is in contact with the first piezoelectric film region; and a second piezoelectric element portion including a second piezoelectric film region and a second electrode which is in contact with the second piezoelectric film region, the first and second piezoelectric element portions being supported by one structure, wherein the first piezoelectric film region and the second piezoelectric film region have the same cation ratio with a lead zirconate titanate-based perovskite oxide as a primary component, the first piezoelectric film region and the second piezoelectric film region have different piezoelectric characteristics, and the first piezoelectric film region has a smaller absolute value of a piezoelectric constant $d_{31}$ and a smaller dielectric loss tan δ than the second piezoelectric film region, and a third electrode which faces the first electrode with the first piezoelectric film region interposed therebetween, and a fourth electrode which faces the second electrode with the second piezoelectric film region interposed therebetween are provided.

2. The piezoelectric device according to claim 1, wherein the first piezoelectric film region and the second piezoelectric film region are different regions in one continuous piezoelectric film.

3. The piezoelectric device according to claim 2, wherein the structure has a flat surface, and the one continuous piezoelectric film is provided on the flat surface.

4. The piezoelectric device according to claim 1, wherein the first piezoelectric film region is provided on a first piezoelectric film, and the second piezoelectric film region is provided on a second piezoelectric film separated from the first piezoelectric film.

5. The piezoelectric device according to claim 1, further comprising a circuit which causes the first piezoelectric element portion to function as a sensor and the second piezoelectric element portion to function as an actuator.

6. The piezoelectric device according to claim 1, wherein each of the first piezoelectric film region and the second piezoelectric film region has ferroelectric hysteresis characteristics and two coercive electric fields, and a positive coercive electric field and a negative coercive electric field of the first piezoelectric film region have the same polarity.

7. The piezoelectric device according to claim 1, wherein a rate of change of a piezoelectric constant with respect to a bias voltage in the first piezoelectric film region is smaller than that in the second piezoelectric film region.

8. The piezoelectric device according to claim 1, wherein the lead zirconate titanate-based perovskite oxide is represented by $Pb(Zr_y,Ti_z,D_{1-y-z})O_3$, and the D element is at least one of V, Nb, Ta, Sb, Mo, or W.

9. The piezoelectric device according to claim 8, wherein the D element is Nb.

10. A method of manufacturing a piezoelectric device, the method comprising:

forming a piezoelectric film formed of a thin film of a lead zirconate titanate-based perovskite oxide on a substrate; and irradiating at least a first region out of the first region and a second region of the piezoelectric film with electromagnetic waves having a wavelength of 230 nm or less in a reducing atmosphere to provide a difference in piezoelectric characteristics between the first region and the second region so that the first region has a smaller absolute value of a piezoelectric constant $d_{31}$ and a smaller dielectric loss tan δ than the second region.

11. The method of manufacturing a piezoelectric device according to claim 10, wherein in a case where both the first region and the second region are irradiated with the electromagnetic waves, an irradiation dose to the first region is set to be larger than that to the second region.

12. The method of manufacturing a piezoelectric device according to claim 10, wherein the electromagnetic waves have a wavelength of 190 nm or less.

13. A piezoelectric device comprising:

a first piezoelectric element portion including a first piezoelectric film region and a first electrode which is in contact with the first piezoelectric film region; and a second piezoelectric element portion including a second piezoelectric film region and a second electrode which is in contact with the second piezoelectric film region, the first and second piezoelectric element portions being supported by one structure, wherein the first piezoelectric film region and the second piezoelectric film region have the same cation ratio with a lead zirconate titanate-based perovskite oxide as a primary component, the first piezoelectric film region and the second piezoelectric film region have different piezoelectric characteristics, and the first piezoelectric film region has a smaller absolute value of a piezoelectric constant $d_{31}$ and a smaller dielectric loss tan δ than the second piezoelectric film region, and the structure has two surfaces having a common normal direction, the first piezoelectric element portion is provided on one of the two surfaces, and the second piezoelectric element portion is provided on the other surface.

14. The piezoelectric device according to claim 13, wherein the first piezoelectric film region and the second piezoelectric film region are different regions in one continuous piezoelectric film.

15. The piezoelectric device according to claim 14, wherein the structure has a flat surface, and the one continuous piezoelectric film is provided on the flat surface.

16. The piezoelectric device according to claim 13, wherein the first piezoelectric film region is provided on a first piezoelectric film, and the second piezoelectric film region is provided on a second piezoelectric film separated from the first piezoelectric film.

17. The piezoelectric device according to claim 13, further comprising a circuit which causes the first piezoelectric element portion to function as a sensor and the second piezoelectric element portion to function as an actuator.

18. The piezoelectric device according to claim 13, wherein each of the first piezoelectric film region and the second piezoelectric film region has ferroelectric hysteresis characteristics and two coercive electric fields, and a positive coercive electric field and a negative coercive electric field of the first piezoelectric film region have the same polarity.

19. The piezoelectric device according to claim 13, wherein a rate of change of a piezoelectric constant with respect to a bias voltage in the first piezoelectric film region is smaller than that in the second piezoelectric film region.

20. The piezoelectric device according to claim 13, wherein the lead zirconate titanate-based perovskite oxide is represented by $Pb(Zr_y,Ti_z,D_{1-y-z})O_3$, and the D element is at least one of V, Nb, Ta, Sb, Mo, or W.

\* \* \* \* \*